United States Patent [19]
Lee et al.

[11] Patent Number: 5,843,843
[45] Date of Patent: Dec. 1, 1998

[54] METHOD FOR FORMING A WIRING LAYER A SEMICONDUCTOR DEVICE

[75] Inventors: Sang-in Lee, Suwon; Gil-heyun Choi, Anyang, both of Rep. of Korea

[73] Assignee: Samsung Electronics Co., Ltd., Suwon, Rep. of Korea

[21] Appl. No.: 743,916

[22] Filed: Nov. 5, 1996

Related U.S. Application Data

[63] Continuation of Ser. No. 115,733, Sep. 2, 1993, abandoned.

[30]   Foreign Application Priority Data

Sep. 7, 1992 [KR] Rep. of Korea .................. 92-16301

[51] Int. Cl.$^6$ .................................................. H01L 21/441
[52] U.S. Cl. ..................... 438/688; 438/648; 438/685; 438/672
[58] Field of Search ..................... 438/688, 637, 438/643, 648, 653, 656, 685, 672

[56]            References Cited

U.S. PATENT DOCUMENTS

| | | | |
|---|---|---|---|
| 4,766,006 | 8/1988 | Gaczi | 437/200 |
| 4,783,248 | 11/1988 | Kohlhase et al. . | |
| 4,853,347 | 8/1989 | Bukhman et al. | 437/192 |
| 4,970,176 | 11/1990 | Tracey et al. . | |
| 4,994,162 | 2/1991 | Armstrong et al. . | |
| 5,108,951 | 4/1992 | Chen et al. | 437/187 |
| 5,175,125 | 12/1992 | Wong . | |
| 5,175,126 | 12/1992 | Ho et al. | 437/190 |
| 5,236,869 | 8/1993 | Takagi et al. | 437/190 |
| 5,266,521 | 11/1993 | Lee et al. | 437/188 |
| 5,290,731 | 3/1994 | Sugano et al. | 437/174 |
| 5,296,404 | 3/1994 | Akahori et al. | 437/195 |
| 5,318,923 | 6/1994 | Park . | |

FOREIGN PATENT DOCUMENTS 60-68614  4/1985  Japan .

*Primary Examiner*—Garidad Everhart
*Attorney, Agent, or Firm*—Jones & Volentine, L.L.P.

[57]            ABSTRACT

A method for forming wiring layer of a semiconductor device for improving the step coverage and filling of the contact hole is disclosed. After forming an underlayer of the wiring layer on a semiconductor substrate, the surface of the underlayer is hydrogen-treated by exposing the underlayer to hydrogen plasma or hydrogen radicals to thereby H-terminate the surface portion of the underlayer. Thus, the characteristics of the underlying layer is improved. When depositing a metal such aluminum or aluminum alloy on the underlayer to thereby form a first conductive layer, large grains of the deposited metal are obtained. The step coverage of the deposited metal layer is enhanced and the mobility of the metal grains is increased. When sputtering the metal at a high temperature or when heat-treating the metal layer which has been formed at a low temperature, the filling of the metal into the contact hole is improved.

20 Claims, 13 Drawing Sheets

METHOD FOR FORMING A WIRING LAYER A SEMICONDUCTOR DEVICE

This is a continuation of application Ser. No. 08/115,733, filed on Sep. 2, 1993, which was abandoned upon the filing hereof.

BACKGROUND OF THE INVENTION

1. Field of the Invention

The present invention relates to a method for forming a wiring layer of a semiconductor device, and more particularly, to a method for forming a wiring layer of a semiconductor device having improved step coverage or improved filling of the wiring layer. The present invention is an improvement over the invention which is the subject of pending U.S. patent application Ser. No. 07/879,294 filed on Aug. 24, 1992 now U.S. Pat. No. 5,318,923 as a continuation-in-part of the U.S. patent application Ser. No. 07/585,218 entitled "A Method for Forming A Metal Layer in a Semiconductor Device," filed on Sep. 19, 1990 now abandoned. U.S. patent application Ser. No. 07/897,294 is hereby incorporated by reference.

2. Prior Art

The metallization process is regarded as the most critical step in current semiconductor device manufacturing technology, since it determines the yield, performance (e.g., speed of operation), and reliability of the devices, as the technology advances toward ultra large-scale integration (ULSI). Metal step coverage was not a serious problem in less dense prior art semiconductor devices, because of the inherent features of devices having larger geometries, e.g., contact holes having low aspect ratios (the ratio of depth to width) and shallow steps. However, with increased integration density in semiconductor devices, contact holes have become significantly smaller while impurity-doped regions formed in the surface of the semiconductor substrate have become much shallower. Due to the resulting higher aspect ratio of the contact holes and the larger steps associated with these current greater-density semiconductor devices, it has become necessary to improve the conventional aluminum (Al) metallization process in order to achieve the standard design objectives of high-speed performance, high yield, and good reliability of the semiconductor device. More particularly, the utilization of the conventional Al metallization process in the fabrication of the higher-density integrated semiconductor devices has resulted in such problems as degraded reliability and failure of the Al interconnections due to the high aspect ratio of the contact holes and the resulting poor step coverage of the sputtered Al, an increase in contact resistance caused by silicon (Si) precipitation, and degradation of the shallow junction characteristics due to Al spiking.

FIG. 1 illustrates a cross-sectional view of a portion of a semiconductor wafer having a metal wiring layer formed thereon obtained according to a prior art method, which illustrates a void formation. Referring to FIG. 1, an insulating layer 5 is formed on a semiconductor substrate 1. Then, a contact hole having a high aspect ratio (greater than one), which exposes an impurity-doped region 3 formed in a surface portion of semiconductor substrate 1, is formed in an insulating layer 5 and on impurity-doped region 3. Thereafter, a diffusion barrier layer 7 is formed on insulation layer 5, on the inner surface of the contact hole and on the exposed surface portion of impurity-doped region 3, and a metal layer 9a is deposited by a conventional sputtering method. Here, due to the high aspect ratio of the contact hole, an overhanging portion 15 of the deposited metal layer 9a is formed over the contact hole and a void formation 11a occurs in the contact hole, which deteriorates the reliability of metal layer 9a of a semiconductor device.

In an effort to overcome these problems of the conventional Al metallization process, various new processes have been proposed. For example, for preventing degraded semiconductor reliability caused by the above-mentioned failure of Al interconnections, the following processes have been proposed.

Melting methods have been disclosed in such patent publications such as Japanese Laid-Open Publication No. 62-132348 (by Yukiyasu Sugano, et al.), Japanese Laid-Open Publication No. 63-99546 (by Shinpei Iijima), Japanese Laid-Open Publication No. 62-109341 (by Masahiro Shimizu, et al.), Japanese Laid-Open Publication No. 62-211915 (by Hidekazu Okabayashi, et al.), Japanese Laid-Open Publication No. 1-246831 (by Seiichi Iwamatsu), Japanese Laid-Open Publication No. 59-171374 (by Masaki Satou) and European Patent Application No. 87306084.3 (by Ryoichi Mukai, et al.).

According to the above methods, the contact hole is filled by means of melting and reflowing Al or an Al alloy. To summarize, in the reflowing step, the metal layer of Al or Al alloy is heated beyond its melting temperature, and the thus-melted metal is flowed into the contact hole to fill the same. This reflowing step entails the following drawbacks and disadvantages. First of all, the semiconductor wafer must be disposed horizontally so as to allow proper filling of the contact hole with the flowing melted material. Secondly, the liquid metal layer flowed into the contact hole will seek a lower surface tension, and thus, may, upon solidifying, shrink or warp, and thereby expose the underlying semiconductor material. Further, the heat treatment temperature cannot be precisely controlled, and therefore given results are difficult to reproduce. Moreover, although these methods may fill a contact hole with the melted metal of the metal layer, the remaining areas of the metal layer (outside the contact hole area) may become rough, thereby impairing subsequent photolithography processes. Therefore, a second metallization process may be required to smoothen (or planarize) these rough areas of the metal layer.

As an alternative to melting Al or Al alloy for filling contact holes, and in order to improve the metal step coverage, a multiple step metallization process is disclosed in U.S. Pat. No. 4,970,176 (by Clarence J. Tracy, et al.). According to this above patent, a predetermined first thickness of a metal layer is deposited on a semiconductor wafer at a cold temperature. Then, the temperature is increased to approximately 400° C. to 500° C., which allows the metal layer to reflow while depositing the remaining and relatively thin second thickness of the metal layer. The reflow of the metal layer takes place through grain growth, recrystallization and bulk diffusion.

According to the Tracy et al. method, the step coverage of a contact hole (via hole) having a high aspect ratio can be improved. However, the aluminum or aluminum alloy cannot completely fill a contact hole having an aspect ratio greater than one and a diameter less than 1 $\mu$m, since the aluminum or aluminum alloy is deposited at a high temperature.

In the meantime, Ono et al. have disclosed that when the semiconductor substrate temperature is above 500° C., the liquidity of Al—Si suddenly increases (in Proc., 1990 VMIC Conference, June 11 and 12, pp. 76–82). According to this paper, the stress of an Al-1% Si film changes abruptly near 500° C., and the stress relaxation of such a film occurs rapidly at that temperature. Additionally, the temperature of the semiconductor substrate must be maintained between 500° C. and 550° C. in order to fill the contact holes satisfactorily.

Additionally, Yoda Dakashi et al. have suggested a method for manufacturing a semiconductor device which comprises the steps of forming double barrier layers for preventing a reaction between the wiring layer and the semiconductor substrate or an insulation layer, on the inner surface of the contact holes, and then filling the contact holes with a deposited metal such as an Al—Si alloy while heating the semiconductor substrate to a desired temperature of 500° C. to 550° C., as in the Ono et al. paper (Korean Laid-open Patent Publication No. 90-15277 and European Patent Application No. 90104184.0 corresponding to Japanese Patent Application No. 01-061557 filed on Mar. 14, 1989).

According to the Dakashi and Ono methods, an Al—Si film is deposited at a temperature of 500° C. to 550° C. The Al—Si film thus obtained has a grown-up large diameter of crystalline particles of about ten microns. Therefore, there is a high probability that the Al—Si film has a strong resistance against electron migration but a weak resistance against stress migration. In addition, highly resistant Si is crystallized at the interfaces between crystalline particles of the Al—Si film. Thus, it is necessary to remove the Al—Si film at the areas other than the contact hole area, and the metallization process becomes complicated. Additionally, since the Al—Si film is deposited at a high temperature, a void is formed or metal layer discontinuity occurs.

Additionally, C. S. Park et al. (which includes one of the present inventors) have disclosed a method for forming a metal wiring layer through a contact hole having a high aspect ratio which comprises the steps of depositing an aluminum alloy to a thickness of 3000 Å at a temperature below 150° C. and post-heating the deposited aluminum alloy at a temperature of 550° C. for 180 seconds, to thereby completely fill up the contact hole with aluminum alloy (see: Proc., 1991 VMIC Conference, June 11 and 12, pp. 326–328). This method is included in the above-mentioned U.S. patent application Ser. No. 07/585,218.

FIGS. 2 through 4 show a method for forming a metal layer according to the above invention.

FIG. 2 illustrates a step for forming a first metal layer. A 0.8 μm-sized contact hole 22 having a step formed thereon is formed in an insulating layer 25 coated on semiconductor substrate 10. Then, substrate 21 is put into a sputtering reaction chamber (not shown), in which a first metal layer 27 is formed by depositing a metal such as aluminum (Al) or an Al alloy, at a temperature of 150° C. or less and under a predetermined degree of vacuum. First metal layer 27 thus obtained is comprised of small aluminum grains having a high surface free energy.

FIG. 3 illustrates a step of filling contact hole 22. More particularly, after the semiconductor wafer thus obtained is moved into another sputter reaction chamber (not shown), without breaking the vacuum, first metal layer 27 is heat-treated for at least two minutes at a temperature of 550° C., thereby filling up the contact hole 22 with the metal. At this time, the pressure in the reaction chamber is preferably as low as possible so that the aluminum atoms have a higher surface free energy. In this manner, the metal atoms can more easily migrate into the contact holes, thereby filling them. The reference numeral 27a designates a metal layer filling contact hole 22.

The heat treatment temperature range in the step shown FIG. 3 is between 80% of the melting point of the metal and its melting point, and will vary according to the particular aluminum alloy or aluminum employed.

Since the metal layer is heat-treated at a temperature lower than aluminum's melting point, the metal layer does not melt. For example, at 550° C., the Al atoms deposited by sputtering at a temperature below 150° C. migrate upon heat-treatment at a higher temperature, instead of melting. This migration increases when the surface area is uneven or grainy due to an increase in energy among the surface atoms which are not in full contact with surrounding atoms. Thus, the initially sputtered, grainy layer exhibits an increase in atomic migration upon heat-treatment.

FIG. 4 illustrates a step for forming a second metal layer 29. More particularly, second metal layer 29 is formed by depositing the remainder of the required total metal layer thickness at a temperature selected on the basis of the desired reliability of the semiconductor device, for example at a temperature below 350° C. This completes the formation of the total (composite) metal layer.

According to the above method, the contact hole can be easily and fully filled with metal by using the same sputtering equipment used for the conventional deposition method and then annealing the deposited metal. Therefore, even a contact hole with a high aspect ratio (greater than 1.0) and a size below 1 μm can be completely filled. Also, an etching step as in the above-mentioned Dakashi method is unnecessary. However, when a void is formed in the contact hole or when the step coverage of the metal layer is inadequate, the contact hole cannot be filled up while maintaining such a semiconductor wafer with metal layer at a certain temperature and vacuum level. Further, although a secondary metal layer is subsequently formed on the semiconductor wafer having a previously deposited primary metal layer, good step coverage of the contact hole cannot be assured, and the reliability of the manufactured semiconductor device is degraded due to this inadequate step coverage.

A contact structure consisting of pure Al deposited directly onto Si was adopted in the earliest stages of silicon technology. However, the Al-to-Si contact exhibits some poor contact characteristics such as junction spiking during sintering. The sintering step is performed after the contact metal film has been deposited and patterned. Aluminum absorbs 0.5 to 1% silicon at a contact-alloying temperature between 450° C. and 500° C., to thereby generate Al spiking.

For alleviating the problem of junction spiking at the contacts, aluminum-silicon alloys (1.0 wt % Si) have been widely adopted for manufacturing the contacts and interconnections of integrated circuits. The use of aluminum-silicon alloys instead of pure Al may alleviate the problem of junction spiking, but, unfortunately, causes another problem. That is, during the cooling cycle of the annealing process, the solubility of silicon in the Al decreases with the decreasing temperature. The aluminum thus becomes supersaturated with Si, which causes the nucleation and outgrowth of Si precipitates from the Al—Si solution. Such precipitation occurs both at the Al—$SiO_2$ interface between the Al layer and insulating layer (to thereby form a Si precipitate) and the Al—Si interface in the contacts (to thereby form a Si-nodule). The Si precipitate or Si-nodule increases the wiring resistance or the contact resistance.

It is also presently known that, for improving the reliability of the semiconductor by preventing degradation of the junction characteristics due to Al spiking, a barrier layer can be formed between the wiring layer and the silicon substrate or the insulating layer. For example, in U.S. Pat.

No. 4,897,709 (by Natsuki Yokoyama et al.), a semiconductor device is described which includes a titanium nitride film (barrier layer) formed in a contact hole for preventing a reaction between the metal wiring layer and the semiconductor substrate. Additionally, in Japanese Patent Laid-open Publication No. 61-183942, there is described a method for forming a barrier layer which comprises the steps of forming a refractory metal layer by depositing a metal such as Mo, W, Ti or Ta, forming a titanium nitride layer on the refractory metal layer, and heat-treating the metal layer and the titanium nitride layer to thereby form a refractory metal silicide layer at the inter-surface of the refractory metal layer and semiconductor substrate by a reaction therebetween. Thus, the barrier characteristic is improved.

The heat-treating the diffusion barrier layer is performed by an annealing process under a nitrogen atmosphere at a temperature of 450° C. for about 30 minutes. When the barrier layer does not undergo the annealing process, junction spiking occurs in a subsequent sintering step after Al sputtering or during sputtering Al or an Al alloy at a temperature above 450° C., which is undesirable.

Also, after forming the diffusion barrier layer, a semiconductor wafer should be transported into a sputtering apparatus for forming a metal wiring layer. Thus, the diffusion barrier layer is exposed to the atmosphere.

Exposing the diffusion barrier layer to the atmosphere or annealing process enables a very small amount of atoms of the diffusion barrier layer to react with oxygen to form a very thin oxide layer on the surface portion of the diffusion barrier layer, which improves the diffusion barrier effect. This is called a "stuffing effect."

On the oxide layer, the mobility of aluminum atoms reduces and when depositing an Al-1% Si-0.5% Cu alloy to a thickness of about 6,000 Å at a room temperature, the metal layer thus obtained has a grain size as small as 0.2 $\mu$m. Thus, the step coverage of sputtered Al is insufficient.

In the meantime, on a diffusion barrier layer which is not exposed to the atmosphere or the annealing process, aluminum reacts with the diffusion barrier layer during a subsequent heat-treating step at a high temperature or when depositing an aluminum film by sputtering at a high temperature, to thereby deteriorate the barrier effect of the diffusion barrier layer. Additionally, the surface of the Al metal layer becomes rugged and a surface reflectivity thereof becomes low, which lowers the efficiency of a subsequent photolithography process. Therefore, the annealing process is essential.

As a diffusion barrier layer, titanium nitride (TiN) layer or TiW (or TiW(N)) layer is conventionally used. This layer comprises a micro-structured defect or grain boundary which cannot completely prevent the silicon or aluminum diffusion at the grain boundary when forming a thin film of the diffusion barrier layer.

In order to prevent such a problem, a method wherein the diffusion path is blocked by an "oxygen stuffing" has been suggested. Also, in order to improve wettability between the barrier metal and an Al wire, a method has been suggested for forming a diffusion barrier layer comprising a step of implanting oxygen or silicon into the barrier metal after heat-treating TiN layer as a diffusion barrier layer (Japanese Patent Laid-Open Publication No. 2-26052 by Hagita Masafumi).

Generally, when TiN is exposed to the atmosphere after being deposited, the stuffing effect occurs due to the oxygen in the atmosphere. Oxygen exists as an oxide at the grain boundary as well as on the surface of the barrier metal. In the Hagita Masafumi patent, the surface of the diffusion barrier layer is oxygenated to thereby improve the barrier characteristic.

However, when exposing a barrier layer after forming the barrier layer by depositing Ti or TiN, when depositing TiN while introducing oxygen or when annealing the barrier layer under nitrogen atmosphere including oxygen, there is a high probability that the contact resistance increases.

The barrier characteristics of the TiN layer depends on the exposure time thereof to the atmosphere, the introducing amount of oxygen during deposition, the introducing amount of oxygen during annealing, the annealing temperature etc. Considering these factors, annealing the barrier metal is preferably performed at a temperature of about 450° C. under a $N_2$ atmosphere for 30 to 60 minutes.

FIG. 5 illustrates spectra obtained from the surface of the TiN layer using X-ray Photoelectron Spectroscopy (XPS) after deposition and after annealing at various temperatures. In FIG. 5, the horizontal axis represents the binding energy (eV) of the molecules and the longitudinal axis represents the counted number of electrons per unit energy (N(E)/E). The spectrum indicated by "As Depo" was obtained from the surface of TiN after deposition. Other spectra have been obtained after annealing the TiN layer at 450° C., 550° C. and 660° C. under a $N_2$ atmosphere for 30 minutes. From the same figure, it can be noted that the deposited TiN layer comprises titanium oxides and that after the TiN layer has been annealed at a higher temperature, the annealed TiN layer has more titanium oxides such as $TiO_2$, TiO and $Ti_2O_3$.

FIG. 6 is a sectional view illustrating a diffusion barrier layer comprised of Ti layer and TiN layer and an oxide layer formed on the TiN layer. In the same figure, the oxide layer has been formed when the vacuum broke after forming the diffusion barrier layer. FIG. 7 is a sectional view illustrating a diffusion layer obtained by annealing the diffusion layer of FIG. 6 under a $N_2$ atmosphere, thereby enhancing the barrier characteristic thereof. Here, the oxide layer has grown during the annealing step.

FIG. 8 illustrates a void formation 11b when forming a metal layer by sputtering a metal at a high temperature, on the diffusion barrier layer which has been annealed under a $N_2$ atmosphere. In the same figure, the reference numerals indicate the same portion as in FIG. 1, except for metal layer 9b deposited at a high temperature, oxide layer 8 formed during the annealing step, and void 11b. Also, FIG. 9 illustrates a discontinuity 13 of a metal layer 9c which has been formed when heat-treating a metal layer at a high temperature (below the melting temperature) after forming the metal layer by depositing a metal at a low temperature, on the diffusion barrier layer which has been annealed under a $N_2$ atmosphere. In the same figure, the reference numerals indicate the same portion as in FIG. 1, except for metal layer 9c heat-treated at a high temperature, oxide layer 8 formed during the annealing step and the discontinuity 13.

A tendency of filling the contact holes with a metal in accordance with a kind of the underlying layer when sputtering the metal at a high temperature, has been reported. When a metal layer is formed by sputtering aluminum on the diffusion barrier layer without breaking vacuum after forming the diffusion barrier layer comprised of Ti/TiN (1000 Å/250 Å), the metal layer fills the contact holes having a 0.7–1.2 $\mu$m diameter and a depth of 0.8 $\mu$m. In the meantime, when the diffusion barrier layer undergoes the $N_2$ annealing, contact hole filling of the metal layer is not obtained. The contact hole filling depends on whether TiN of the underlayer reacts with aluminum.

Additionally, H. Nishimura et al. suggested a method wherein aluminum is deposited at a temperature of about 500° C. by a sputtering method without breaking the vacuum after forming a Ti underlayer (see: "Reliable Submicron Vias Using Aluminum Alloy High Temperature Sputtering Filling" Jun. 11–12, 1991 VMIC conference pp. 170–176). According to Nishimura, complete filling of a 0.5 μm diameter via hole with an aspect ratio of 1.6 may be achieved. The aluminum filling occurs due to the reaction between Al and Ti.

However, when aluminum reacts with titanium to form titanium aluminide ($Al_3Ti$), the Si solid solubility of the Al metal layer increase to about 15% by weight at a temperature of 450° C. Therefore, if titanium aluminide is formed in the contact hole, there is a high probability that aluminum alloy spiking occurs in the contact hole due to the reaction between the aluminum metal layer and the silicon substrate. Additionally, if aluminum reacts with titanium, the surface of the aluminum metal layer becomes uneven when sputtering aluminum at a high temperature or when heat-treating the deposited metal layer according to the C. S. Park et al. method.

Therefore, in the contact hole where a diffusion barrier layer is formed, it is preferable that oxides exist on the surface of the diffusion barrier layer and in the grain boundary portion of the diffusion barrier layer.

Dipankar Pramanik et al. have reported the experimental results obtained by depositing Al-1% Cu alloy on various underlayers at 170° C. (see: "Effect of Underlayers on Sputtered Aluminum Structure and its Correlation with Step Coverage in Submicron Vias" by Dipankar Pramanik and Vivek Jain, Jun. 12–13, 1990 VMIC Conference, pp 332–334). According to Pramanik, the grain size of the deposited aluminum layer varies in accordance with the kinds of underlayers. The largest grains were observed on TiW layer. If a large island is formed on the sidewalls, excellent step coverage is obtained. This shows that aluminum step coverage is closely related to the grain size obtained during the deposition step, that is, the larger the grain size of the aluminum obtained during the deposition step, the better the obtained step coverage of the aluminum layer on via sidewall. Also, the better the wettability between the underlayer and the aluminum grains is, the larger aluminum grains are obtained.

SUMMARY OF THE INVENTION

Accordingly, it is an object of the present invention to provide a method for forming a wiring layer of a semiconductor device wherein the wettability between the underlayer and the deposited metal layer is enhanced to thereby improve the step coverage of the deposited metal layer and/or the filling of the opening (such as a contact hole or a via hole) with the deposited metal.

It is another object of the present invention to provide a method for forming a wiring layer of a semiconductor device wherein the characteristics of the underlayer are improved to thereby increase the mobility of the grains of the deposited metal layer so that a complete filling of the opening is easily achieved when performing the C. S. Park method.

To achieve the above objects, the present invention, provides a method for forming a wiring layer of a semiconductor device comprising the steps of: forming an underlayer of the wiring layer on a semiconductor substrate; hydrogen-treating the surface of the underlayer to thereby H-terminate the surface portion of the underlayer so that the characteristics of the underlying layer is improved; and depositing a first conductive material on the underlayer to thereby form a first conductive layer.

According to one aspect of the present invention, the underlayer is an insulating layer having an opening. A lower wiring layer may be formed before forming the underlayer.

According to another aspect of the present invention, the underlayer is a diffusion barrier layer. After forming an insulating layer having an opening exposing a surface portion of a lower structure formed on the semiconductor substrate, the diffusion barrier layer is formed on the insulating layer, on the inner surface of the opening and on the exposed surface portion of the lower structure.

When the lower structure is the semiconductor substrate, the opening is a contact hole for electrically connecting an upper conductive layer with an impurity-doped region of the semiconductor substrate. When the lower structure is a lower wiring layer, the opening is a via hole for electrically connecting an upper conductive layer with the lower wiring layer.

The diffusion barrier layer is comprised of at least one selected from the group consisting of transition metals, transition metal alloys and transition metal compounds. The diffusion barrier layer is preferably comprised of first diffusion barrier layer comprised of a transition metal and a second diffusion barrier layer formed on the first diffusion barrier layer and comprised of a transition metal compound or transition metal alloy.

The hydrogen treating step is performed by exposing the underlayer to hydrogen plasma (or hydrogen radicals).

According to yet another aspect of the present invention, the first conductive layer is formed by depositing a first metal at a low temperature. The first conductive layer may be heat-treated for an appropriate time to migrate grains of the first conductive layer without breaking vacuum. The first conductive layer heat-treating step is carried out at a temperature ranging from 0.8 Tm to Tm, where Tm is the melting temperature of the first conductive material, for one minute or longer.

On the first conductive layer which has been heat-treated as above, a second conductive layer is formed by depositing a second conductive material after the first conductive layer heat-treating step when the thickness of the first conductive layer is less than a predetermined thickness of the wiring layer. The second conductive layer may be also heat-treated to thereby planarize the resultant surface of the second conductive layer in the same manner as in heat-treating the first conductive layer.

According to still another aspect of the present invention, the first conductive layer may be formed by depositing the first conductive material at a high temperature. The high temperature is a temperature ranging from 0.8 Tm to Tm, where Tm is the melting temperature of the first conductive material.

The mobility of the grains of the deposited metal layer and/or the wettability between the diffusion barrier layer and the grains of the deposited metal layer are enhanced while maintaining the barrier effect of the diffusion barrier layer. Therefore, the filling of the deposited metal layer into the opening is improved when sputtering a metal at a high temperature. Further, the step coverage of the metal layer and the reflow characteristics of the metal layer into the opening are enhanced.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE INVENTION

Hereinafter, the present invention will be described in detail with reference to the drawings.

According to a method of the present invention, an underlayer of the wiring layer is formed on a semiconductor substrate and then the surface thereof is hydrogen-treated to thereby H-terminate the surface portion of the underlayer so that the characteristics of the underlayer are improved. Thereafter, a first conductive material is deposited on the underlayer to thereby form a first conductive layer.

The underlayer may be an insulating layer having an opening. A lower wiring layer may be formed before forming the underlayer.

Also, the underlayer may be a diffusion barrier layer. After forming an insulating layer having an opening exposing a surface portion of a lower structure formed on the semiconductor substrate, the diffusion barrier layer is formed on the insulating layer, on the inner surface of the opening and on the exposed surface portion of the lower structure.

When the lower structure is the semiconductor substrate, the opening is a contact hole for electrically connecting an upper conductive layer with an impurity-doped region of the semiconductor substrate. When the lower structure is a lower wiring layer, the opening is a via hole for electrically connecting an upper conductive layer with the lower wiring layer.

The diffusion barrier layer is comprised of at least one selected from the group consisting of transition metals (for example, Ti), transition metal alloys (for example, TiW) and transition metal compounds (for example, TiN).

The diffusion barrier layer may be a single layer comprised of TiN or TiW. However, it is preferable that a composite layer consisting of a first diffusion barrier layer comprised of a transition metal and a second diffusion barrier layer comprised of a transition metal compound is formed as a diffusion barrier layer.

In the present invention, the hydrogen treating step is performed by exposing the underlayer to hydrogen plasma (or hydrogen radicals).

Figure 1:
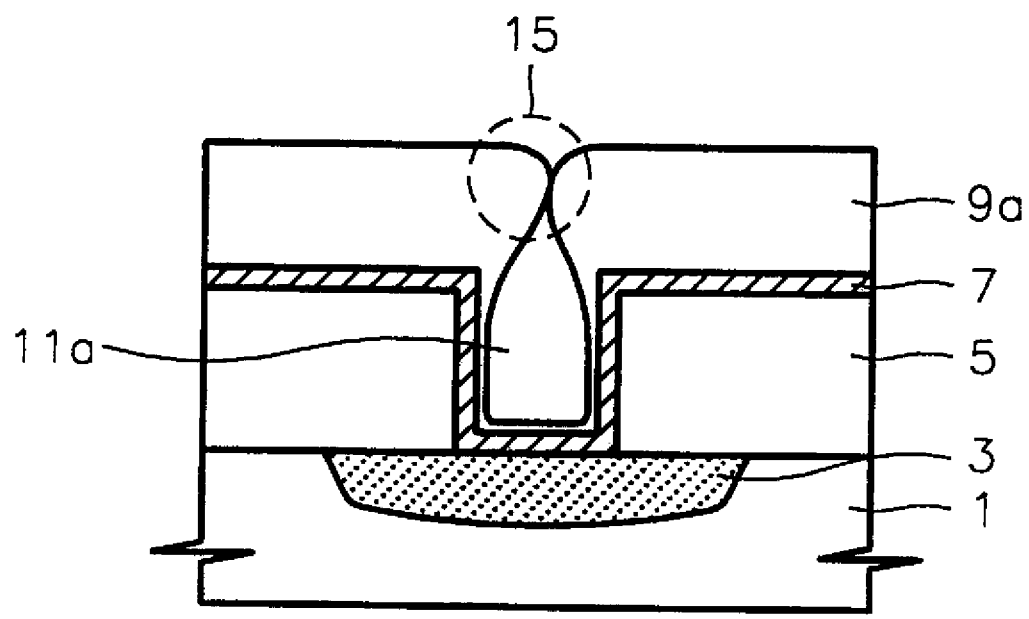
FIG. 1 illustrates a cross-sectional view of a portion of a semiconductor wafer having a metal wiring layer formed thereon obtained according to a prior art method, which illustrates a void formation.
Figure 2:
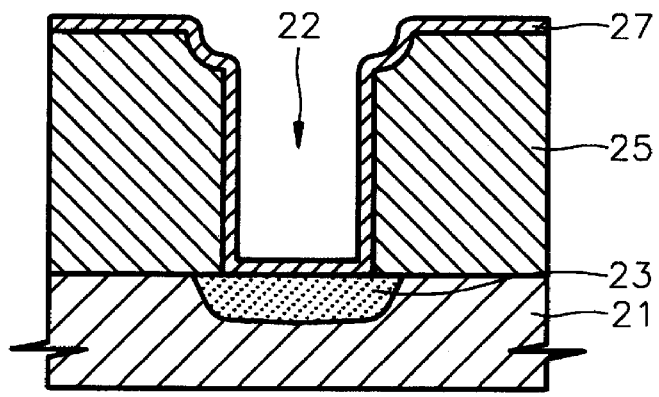
FIGS. 2 to 4 illustrate a method for forming a wiring layer as described in U.S. patent application Ser. No. 07/897,294.
Figure 3:
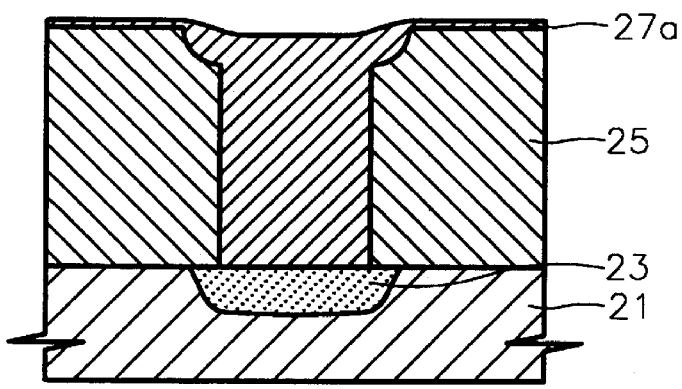
Figure 4:
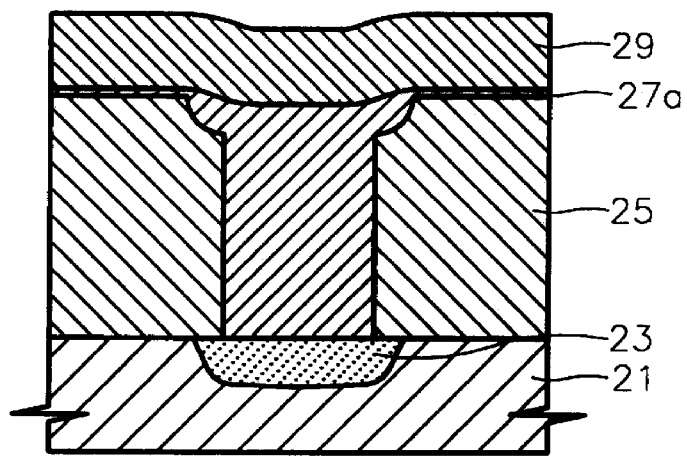
Figure 5:
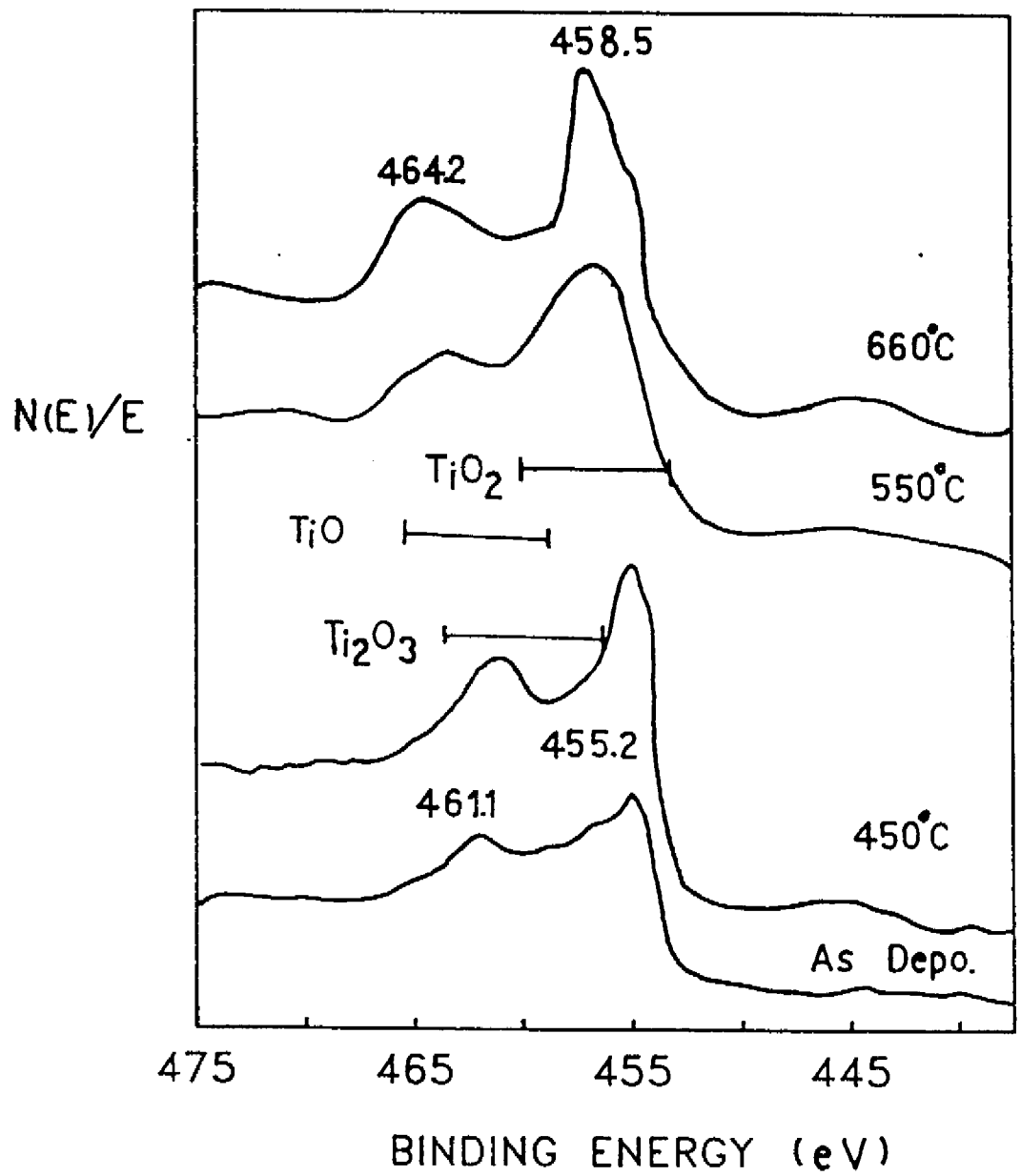
FIG. 5 illustrates spectra obtained from the surface of the TiN layer using X-ray photoelectron spectroscopy (XPS) after deposition and after annealing at various temperatures under $N_2$ atmosphere.
Figure 6:
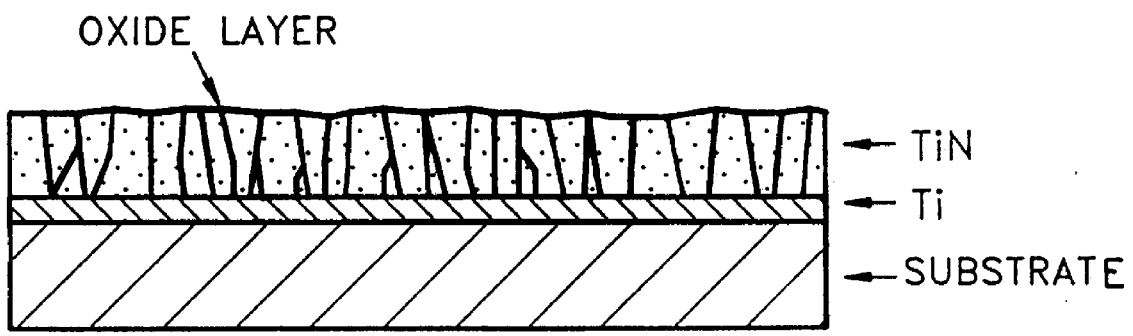
FIG. 6 is a sectional view illustrating a diffusion barrier layer comprised of a Ti layer and TiN layer and an oxide layer formed on the TiN layer.
Figure 7:
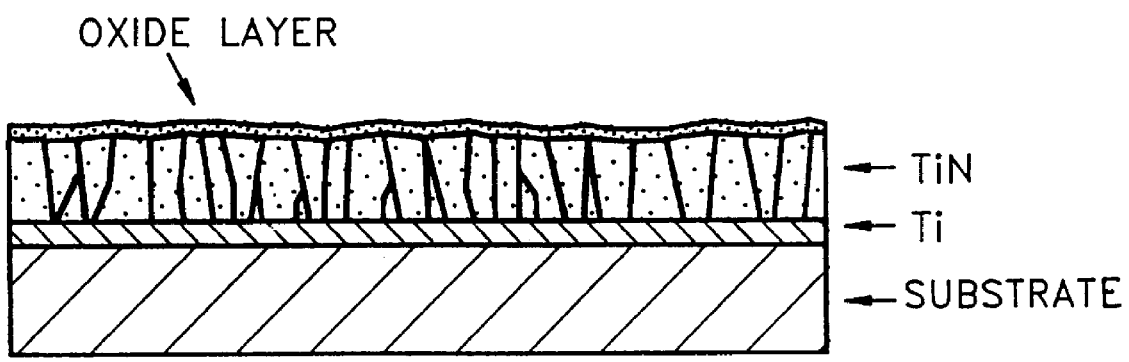
FIG. 7 is a sectional view illustrating a diffusion layer obtained by annealing the diffusion layer of FIG. 6 under a $N_2$ atmosphere, thereby enhancing the barrier characteristic thereof.
Figure 8:
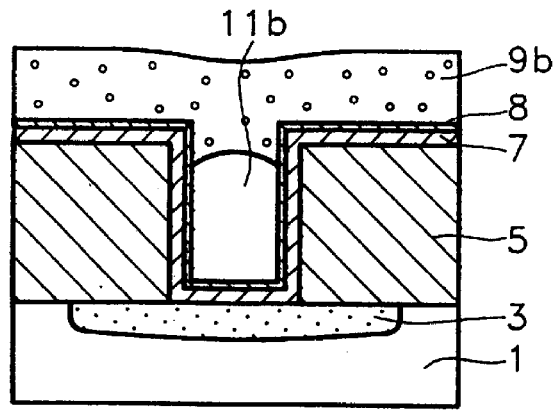
FIG. 8 illustrates a void formation when forming a metal layer by sputtering a metal at a high temperature on the diffusion barrier layer which has been annealed under a $N_2$ atmosphere.
Figure 9:
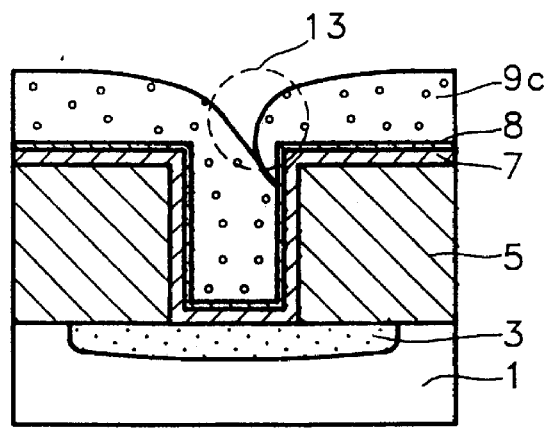
FIG. 9 illustrates a discontinuity of a metal layer which has been formed when heat-treating a metal layer at a high temperature (below the melting temperature) after forming the metal layer by depositing a metal at a low temperature, on the diffusion barrier layer which has been annealed under a $N_2$ atmosphere.
Figure 10:
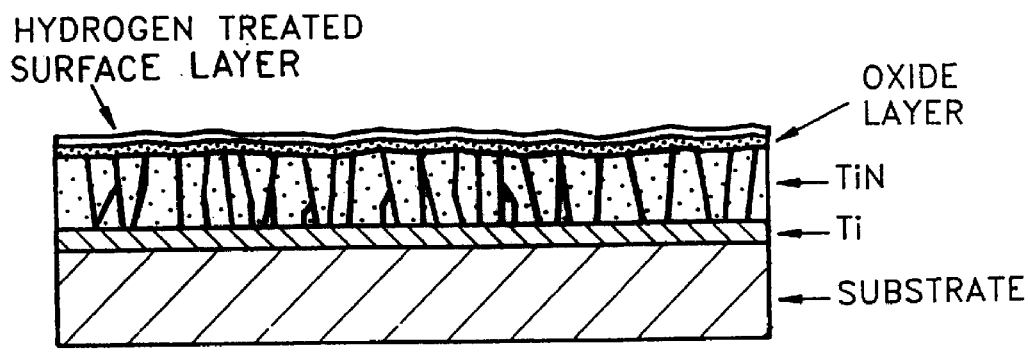
FIG. 10 is a sectional view showing a diffusion barrier layer obtained by hydrogen-treating the diffusion barrier layer in FIG. 7.

FIG. 10 is a sectional view showing a diffusion barrier layer obtained by hydrogen-treating the diffusion barrier layer in FIG. 7. In FIG. 10, it can be noted that a hydrogen-treated surface layer exists on the oxide layer comprised of TiO, $Ti_2O_3$ or $TiO_2$.

Recently, M. Delfino et al. have suggested an electron cyclotron resonance (ECR) $H_2$ plasma cleaning process (see "Plasma-cleaned Si Analyzed in situ by X-ray Photoelectron Spectroscopy" by M. Delfino et al., J. Appl. Phys., 71(2), 15 Jan. 1992). According to the M. Delfino et al. paper, silicon surfaces are cleaned in an ECR excited hydrogen plasma, whereby the native oxide formed on the substrate may be completely removed. The above ECR $H_2$ plasma cleaning process has an advantage that neither heating the substrate nor applying bias to the substrate is necessary. When a silicon cleaning process is performed via radio frequency (RF) etching using argon ions, the threshold voltage of a semiconductor device is shifted due to a high vias voltage applied to the substrate. Additionally, since the etching is performed by the bombardment of argon ions, the argon ions are implanted into the substrate or the underlayer due to the knock-on effect, thereby pushing atoms of the underlayer into the underlying lower structure.

The oxides layer formed on the diffusion barrier layer may be removed by the RF etching process. However, when RF etching is performed in order to remove the native oxide layer on the surface of the diffusion barrier layer, a high bias voltage must be applied. Additionally, since atoms of the native oxide layer are shifted into the diffusion barrier layer due to the above knock-on effect, a small amount of oxides remains on the diffusion barrier layer.

In the present invention, the outer surface portion of the oxide layer on the surface of the diffusion barrier layer is reduced (or hydrogen-terminated) by using the above ECR-excited $H_2$ plasma, without removing the oxides on the diffusion barrier layer. Thus, the mobility of the metal layer and/or the wettability between the diffusion barrier layer and the grains of the deposited metal layer is enhanced while maintaining the barrier effect of the diffusion barrier layer. Here, the filling of the deposited metal layer into the contact hole is improved.

Additionally, when hydrogen-treating the surface of an insulating layer having on opening or the inner surface of the opening to thereby hydrogen-terminate the surfaces of thereof, the wettability between the insulating layer and the deposited metal layer is improved. Therefore, the step coverage of the metal layer or the filling of the metal layer into the opening during the heat-treating step is enhanced. It is presumed that such an improvement of the wettability of the metal layer against the underlayer is due to the reaction between a portion of the atoms of the deposited metal layer and those of the hydrogen-treated surface layer of the underlayer.

On the above hydrogen-treated underlayer, a first conductive material is deposited to thereby form a first conductive layer.

The first conductive layer may be a single layer obtained by depositing in a vacuum at a low temperature a pure aluminum, an aluminum alloy having no Si component (such as Al-0.5% Cu alloy, Al—Ti alloy etc.) or an aluminum alloy having a Si component (such as Al-1% Si alloy, Al-0.5% Cu-1% Si alloy etc). For preventing a Si precipitation, the first conductive layer may be formed by depositing a metal which contains not more than 0.5% by weight of a Si component such as an aluminum alloy having not more than 0.5% (preferably, 0.2–0.5% by weight) by weight of a Si component. The first conductive layer is preferably a composite layer formed by depositing a first metal to form a first metal layer and a second metal to form a second metal layer in a vacuum a low temperature. The first metal is an aluminum alloy having a Si component such as an Al—Si alloy (Al-1% Si alloy) or an Al—Cu—Si alloy (Al-0.5% Cu-1% Si alloy) and the second metal is pure aluminum or an aluminum alloy having no Si component such as Al—Cu alloy (Al-0.5% Cu alloy) or Al—Ti alloy. When a metal having a Si component an a metal having no Si component are successively deposited to form a composite metal layer as a first conductive layer, a metal layer having no Si component absorbs Si atoms from the metal layer having a Si component, during the heat-treating step.

Therefore, Si precipitates are not formed on the surface of the semiconductor substrate after forming the wiring pattern, and Al spiking is eliminated. The first metal and the second metal are deposited at a temperature below 150° C. by a sputtering method. Here, a bias voltage of −20 to −200V may be applied to semiconductor substrate during the depositing step.

The first conductive layer may be formed to have a total thickness of the wiring layer or less than that of the wiring layer.

Figure 11:
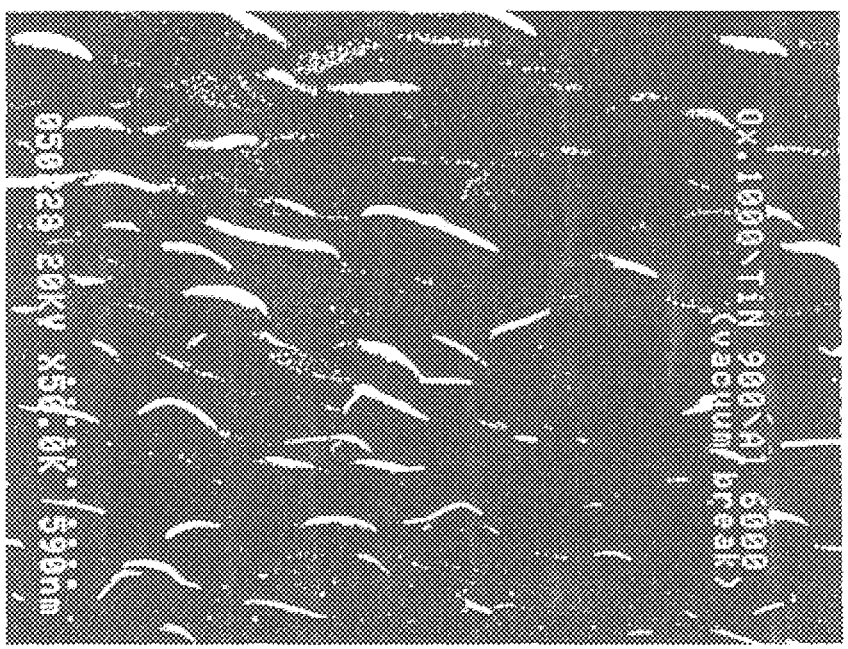
FIG. 11 is an SEM picture of the surface of a metal layer obtained by depositing Al-1% Si-0.5 Cu to a thickness of 6,000 Å on the diffusion barrier layer (comprised of TiN) which has been exposed to the atmosphere.
Figure 12:
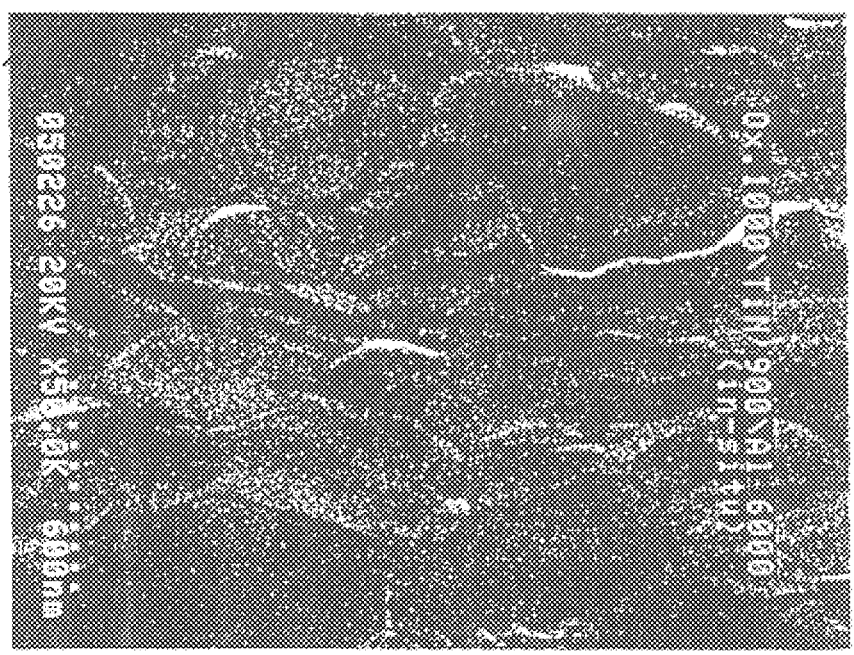
FIG. 12 is an SEM picture of the surface of a metal layer obtained by forming a TiN layer as a diffusion barrier, annealing the TiN layer under a $N_2$ atmosphere for thirty minutes, hydrogen-treating the TiN layer by exposing to the ECR-excited $H_2$ plasma and then depositing Al-1% Si-0.5 Cu to a thickness of 6,000 Å on the hydrogen-treated TiN layer without breaking the vacuum.

FIG. 11 is an SEM picture of the surface of a metal layer which has been obtained by depositing Al-1% Si-0.5 Cu to a thickness of 6,000 Å on the diffusion barrier layer (comprised of TiN) which has been exposed to the atmosphere. FIG. 12 is an SEM picture of the surface of a metal layer which has been obtained by forming a TiN layer as a diffusion barrier, annealing the TiN layer under a $N_2$ atmosphere for thirty minutes, hydrogen-treating the TiN layer by exposing to the ECR-excited $H_2$ plasma and then subsequently depositing Al-1% Si-0.5 Cu to a thickness of 6,000 Å on the hydrogen-treated TiN layer without breaking the vacuum.

Figure 13:
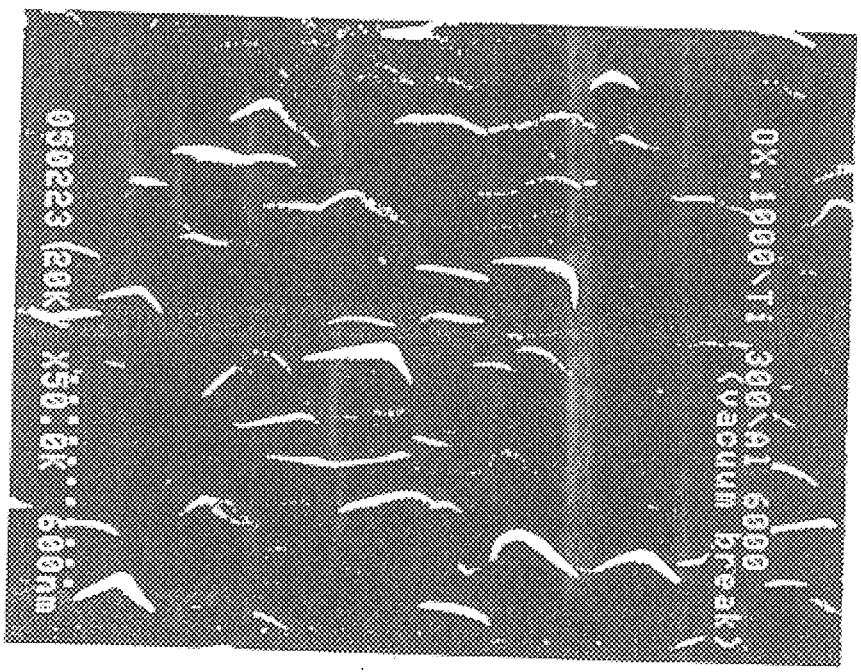
FIG. 13 is an SEM picture of the surface of a metal layer obtained by depositing Al-1% Si-0.5 Cu to a thickness of 6,000 Å on the diffusion barrier layer (comprised of Ti) which has been exposed to the atmosphere.
Figure 14:
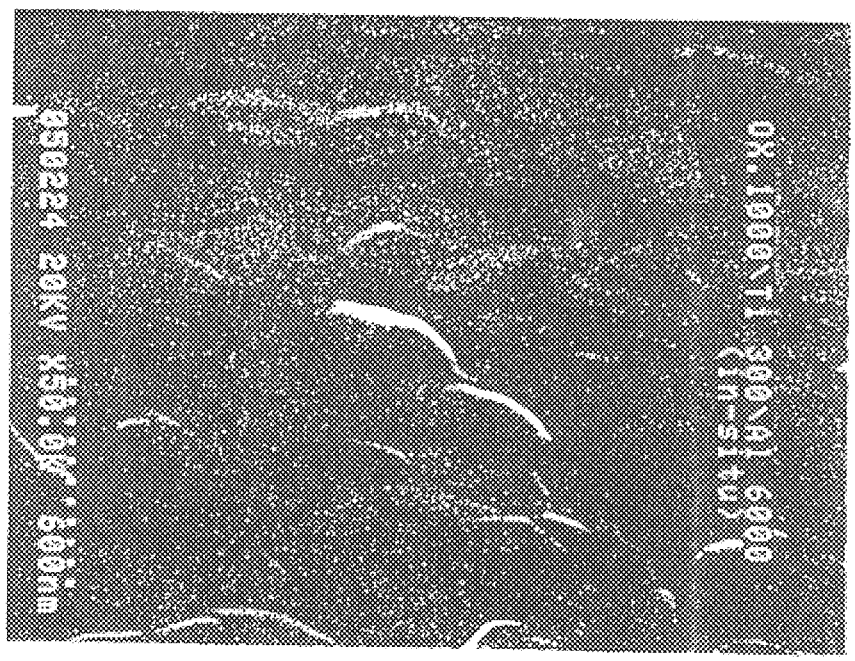
FIG. 14 is an SEM picture of the surface of a metal layer obtained by forming a Ti layer as a diffusion barrier, annealing the Ti layer under a $N_2$ atmosphere for thirty minutes, hydrogen-treating the Ti layer by exposing to the ECR-excited $H_2$ plasma and then depositing Al-1% Si-0.5 Cu to a thickness of 6,000 Å on the hydrogen-treated Ti layer without breaking the vacuum.

FIG. 13 is an SEM picture of the surface of a metal layer obtained by depositing Al-1% Si-0.5 Cu to a thickness of 6,000 Å on the diffusion barrier layer (comprised of Ti) which has been exposed to the atmosphere. FIG. 14 is an SEM picture of the surface of a metal layer obtained by forming a Ti layer as a diffusion barrier, annealing the Ti layer under a $N_2$ atmosphere for thirty minutes, hydrogen-treating the Ti layer by exposing to the ECR-excited $H_2$ plasma and then depositing Al-1% Si-0.5 Cu to a thickness of 6,000 Å on the hydrogen-treated Ti layer without breaking the vacuum.

From FIGS. 11 to 14, it can be noted that the aluminum metal layer formed on the Ti or TiN layer which has not undergone hydrogen-treating, has small grains having a size of about 0.2 $\mu$m while the aluminum metal layer formed on the Ti or TiN layer which has undergone hydrogen-treating has a relatively large grains having a size about 0.5 $\mu$m to 1.0 $\mu$m. This shows that the larger grains of the metal layer are formed on the hydrogen-treated underlayer than on the conventional underlayer which has not undergone hydrogen-treating. Therefore, hydrogen-treating the underlayer, enhances the step coverage of the metal layer as can be seen with reference to the above Pramanik paper.

After forming an anti-reflective layer on the first conductive layer, the first conductive layer may be patterned via a conventional photolithography process, to thereby complete a wiring layer of a semiconductor device.

Preferably, the first conductive layer is heat-treated for an appropriate time to migrate grains of the first conductive layer without breaking vacuum in accordance with the C. S. Park method. After being formed in a vacuum, the first conductive layer is heat-treated, without breaking the vacuum. When heat-treating a metal layer (which has formed by depositing the metal at a low temperature) at a temperature ranging from 0.8 Tm to Tm (where Tm is the melting temperature of the metal), the contact hole can be easily filled with the metal.

The heat treatment is carried out by heating the semiconductor substrate in an inert atmosphere of 10 mTorr or less or in a vacuum of $5\times10^{-7}$ torr or less, at a temperature ranging from 0.8 Tm to Tm (preferably 500°–550° C.), where Tm is the melting temperature of the first conductive material, using a gas conduction method or a rapid thermal annealing (RTA) method. The above heat-treatment step is carried out for not less than one minute, preferably for 1–5 minutes when using an argon gas conduction method, and when using the RTA apparatus, the metal layer is preferably heat-treated for several cycles of about 20–30 seconds, or continuously for about two minutes. Other heat-treating methods, such as lamp heating, can be used. These heat-treating methods may be used alone or in combination with others. The heat-treating step is carried out in an inert gas (e.g., $N_2$ or Ar) atmosphere or a reductive gas (e.g., $H_2$) atmosphere. When the metal layer is heat-treated, the metal atoms migrate into the opening, in order to reduce the surface free energy thereof. The migration of the grains of the metal causes its surface free energy to be reduced, thereby decreasing the surface area of the deposited metal layer and facilitating the complete filling of opening with the first conductive layer material. Here, some titanium atoms in the hydrogen-treated surface layer react with the first conductive material (aluminum), to thereby enhance the filling of the opening. As a result, the opening is completely filled up with the metal. An overhanging portion of the metal layer disappears from the upper portion of the opening, and the inlet area of the opening becomes larger. Thus, when depositing a second conductive layer thereafter, good step coverage of the metal layer can be obtained.

If the vacuum is broken during the above heat-treatment step, oxidation causes formation of an $Al_2O_3$ film, which prevents the Al atoms from migrating into the opening at the above temperature. Therefore, the opening cannot be completely filled up with the metal, which is obviously undesirable.

A second conductive layer may be further formed by depositing a second conductive material on the first conductive which has been heat-treated as above after the heat-treating step when the thickness of the first conductive layer is less than a predetermined thickness of the wiring layer. When first conductive layer has a thickness 600 Å to 4,800 Å and the wiring layer has a thickness of 6,000 Å, a second conductive layer is formed so that the sum of the thicknesses of the first and second conductive layer is equal to the thickness of the wiring layer. That is, second conductive layer (not shown) is formed by depositing a third metal such as a pure aluminum, an aluminum alloy to a thickness of 5,400 to 6,000 Å in the same manner as in forming first conductive layer. The second conductive layer is preferably formed by depositing a metal having no Si component selected from a group consisting of pure aluminum, an Al—Cu alloy and an Al—Ti alloy, when the first conductive layer is comprised of a metal having a Si component. The above third metal is deposited at a temperature below 350° C.

The second conductive layer may be also heat-treated to thereby planarize the resultant surface of the second conductive layer in the same manner as in heat-treating the first conductive layer. Performing this step enables the atoms of the metal layer to migrate into the opening, thereby filling it more completely to result in a wholly planarized wiring layer. Thus, a subsequent photolithograpy process can be more easily and effectively carried out.

The first conductive layer may be formed by depositing the first conductive material via a sputtering method at a high temperature. The high temperature is a temperature ranging from 0.8 Tm to Tm, where Tm is the melting temperature of the first conductive material, when an Al—Si alloy is used. When a metal is deposited at a high temperature on the underlayer after hydrogen-treating the underlayer, the deposited metal layer exhibits a good step coverage.

Further, the first conductive layer may be formed by depositing a first metal at a low temperature (below 200° C.) and depositing a second metal at a high temperature (ranging from 0.8 Tm to Tm, where Tm is the melting temperature of the second metal).

Hereinafter, the method for forming a wiring layer according to the present invention will be described in details by the following preferred examples.

EXAMPLE 1

Figure 15:
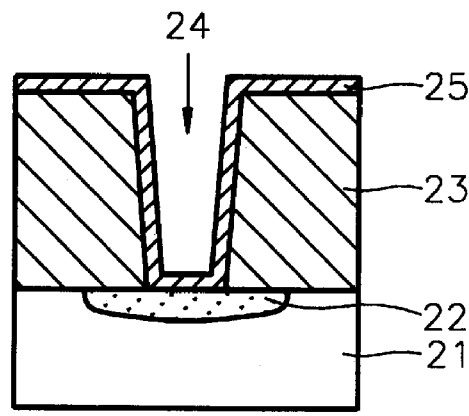
FIGS. 15 to 17 are sectional views for illustrating a first example of a method for forming a wiring layer according to the present invention.
Figure 16:
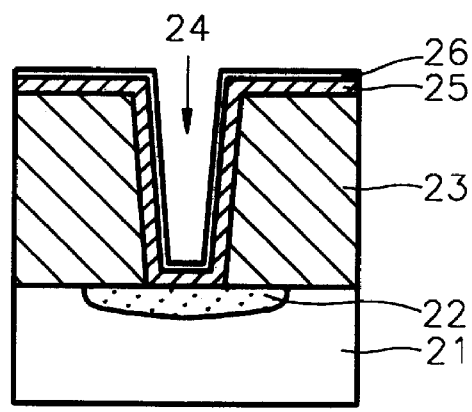
Figure 17:
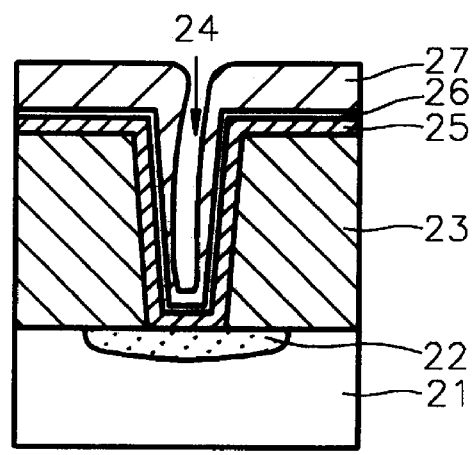

FIGS. 15 to 17 are sectional views for illustrating a first example of a method for forming a wiring layer according to the present invention.

FIG. 15 illustrates a step of forming a diffusion barrier layer 25. More particularly, by using boro-phosphorous silicate glass (BPSG), an insulating layer 23 having a thickness of about 0.8–1.6 μm was formed on a semiconductor substrate 21 having an n-type impurity-doped region 22 in a surface portion thereof.

Then, insulating layer 23 was provided with an opening exposing a surface portion of impurity-doped region 22. Here, the opening was a 0.7 μm-sized contact hole 24 having a tapered shape for electrically connecting a wiring layer with impurity-doped region 22. The size of the contact hole was given as the mean value of all the diameters of the tapered contact hole, with the largest diameter being about 0.5–1.0 μm and the smallest diameter being about 0.3–0.7 μm.

Next, a diffusion barrier layer 25 was formed on the entire surface of insulating layer 23, on the inner surface of opening 24 and on the exposed surface portion of semiconductor substrate 21.

A composite layer as the diffusion barrier layer 25 was formed by depositing Ti on the surface of insulating layer 23, on the inner surface of opening 24 and on an exposed surface portion of the semiconductor substrate 21 to a thickness of about 100–300 Å under an argon atmosphere of 7 mTorr by a sputtering method to form a first diffusion barrier layer and then depositing TiN to a thickness of about 300–1,500 Å on the first diffusion barrier layer to form a second diffusion barrier layer. Here, TiN is deposited by a reactive sputtering method in a DC magnetron sputtering chamber. By adjusting the mole ratio of $N_2$ to Ar+$N_2$ to 40%, Ar and $N_2$ gases were introduced into a vacuum chamber and then TiN was deposited at 7 mTorr. At this time, the temperature of substrate 21 was maintained at 200° C. when depositing Ti and TiN.

Thereafter, diffusion barrier layer 25 was annealed (that is, heat-treated) at a temperature of about 450°–500° C. in a nitrogen atmosphere for about 30–60 minutes in order to enhance the barrier effect. At this time, a small amount of oxygen was introduced so that an oxide layer (comprised of $TiO_2$, TiO and $Ti_2O_3$) as shown in FIG. 7 was formed on the surface of diffusion barrier layer.

FIG. 16 illustrates a step of hydrogen-treating diffusion barrier layer 25, to thereby form a hydrogen-treated surface layer 26. Diffusion barrier layer 25 obtained as above was treated in an ECR apparatus which generates a hydrogen plasma, at 2.5 mTorr of hydrogen pressure, at 1 kW of microwave power and at 0V of bias voltage, for ten seconds to one minute while maintaining the substrate temperature at 25° C. Thus, hydrogen-treated surface layer 26 as shown in FIG. 10 was obtained on the oxide layer formed on the surface of diffusion barrier layer 25.

FIG. 17 illustrates a step of forming a first conductive layer 27. After the step of FIG. 16, first conductive layer 27 was formed on diffusion barrier layer 25 without breaking the vacuum.

First conductive layer 27 was formed by depositing in a vacuum at a low temperature Al-0.5% Cu-1% Si alloy to a thickness of 6,000 Å. The aluminum alloy was deposited at a temperature below 150° C. by a sputtering method. Deposition was performed at a deposition rate of 120 Å/s and under an Ar atmosphere of 4 mTorr. Here, a bias voltage of −20 to −200V was applied to semiconductor substrate 21 during the depositing step.

First conductive layer 27 thus obtained was observed with a electron microscope and found to have large aluminum grains (about 0.5 μm to 1.0 μm) formed thereon, as shown in FIG. 12.

Thereafter, an anti-reflective layer (not shown) was formed by depositing titanium nitride to a thickness of 200–500 Å on first conductive layer 27, using a sputtering method, in order to improve the subsequent photolithography process. Then, a predetermined resist pattern (not shown) for forming the wiring layer of a semiconductor device was formed on the anti-reflective layer by a conventional photolithography process. Then, using the above resist pattern as an etching mask, the anti-reflective layer, first conductive layer 27 and diffusion barrier layer 25 having hydrogen-treated surface layer 26 formed thereon were subsequently etched to complete the wiring layer according to the present invention.

Since the step coverage of first conductive layer 27 was improved when compared to the conventional method which does not include the hydrogen-treating step, the reliability of the wiring layer was enhanced.

Comparative Example 1

A metal wiring layer was formed in the same manner as in Example 1, except that the hydrogen-treating step was omitted.

The first conductive layer thus obtained was observed with an electron microscope and found to have small aluminum grains (about 0.2 μm) formed thereon, as shown in FIG. 11.

Figure 30A:
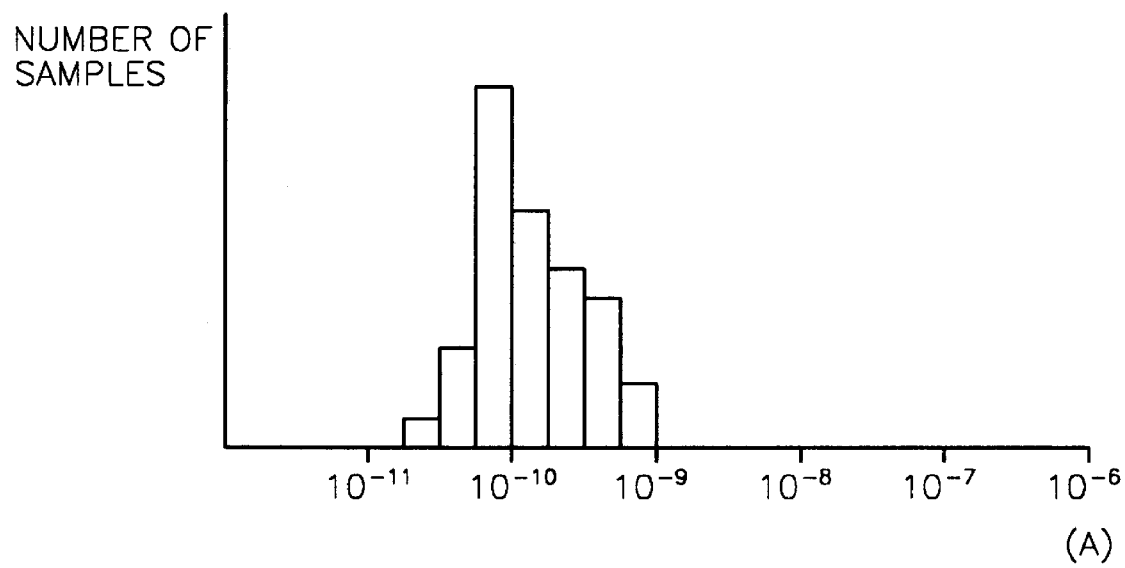
FIG. 30 shows graphs of junction leakage currents observed in the contact holes of the wiring layers obtained by Example 1 and Comparative Example 1.
Figure 30B:
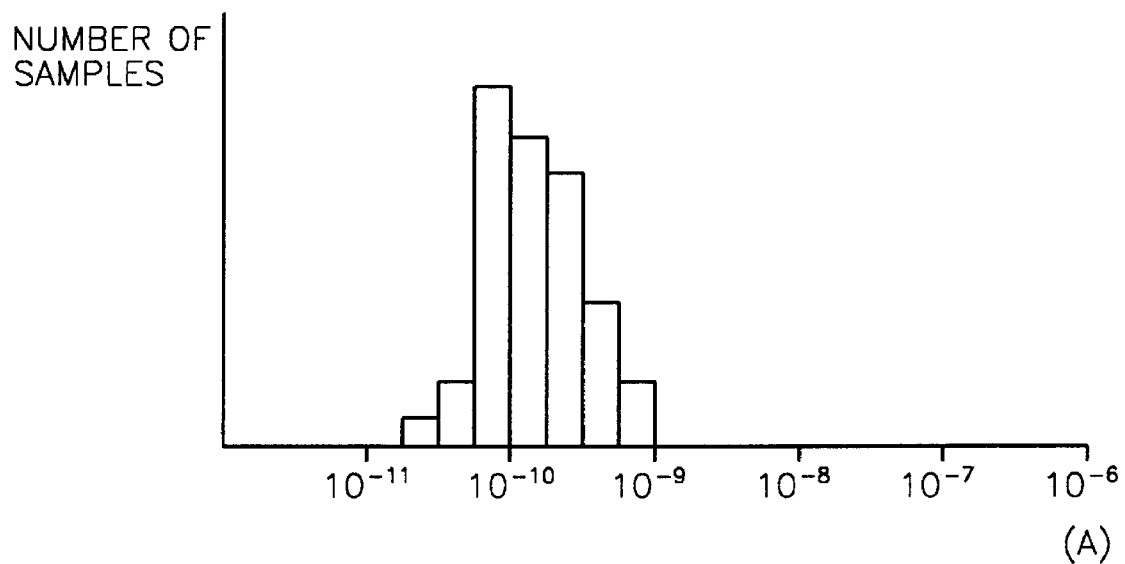

Junction leakage currents have been observed on contact holes after sintering the wirings layer obtained according to Example 1 and Comparative Example 1 at 450° C. for twelve hours under an N₂ atmosphere. FIG. 30 shows graphs of junction leakage currents observed in the contact holes of the wiring layers obtained by Example 1 and Comparative Example 1.

In FIG. 30, graph A has been obtained by observing the junction leakage current on ten thousand contact holes obtained by Comparative Example 1, and graph B has been obtained by observing the junction leakage currents on ten thousand contact holes obtained by Example 1.

From FIG. 30, it can be noted that the wiring layers obtained according to a method of the present invention, maintain the similar leakage currents to those of the conventional process since the oxide layer remains on the surface of the diffusion barrier layer. Therefore, the barrier effect of the diffusion barrier layer according to the present invention is the same as that of the diffusion barrier layer according to the conventional method.

In the meantime, according to Example 1 of the present invention, hydrogen-treating the underlayer improved the wettability between the deposited metal layer and the underlayer. Since an aluminum alloy was deposited on the hydrogen-treated surface layer of the underlayer having the improved wettability, grains (as shown in FIG. 12) of the deposited metal layer are formed which are larger than Comparative Example 1. Thus, we can see that the step coverage of the metal layer of the present invention was remarkably enhanced to thereby improve the reliability of the wiring layer of the semiconductor.

EXAMPLE 2

Figure 18:
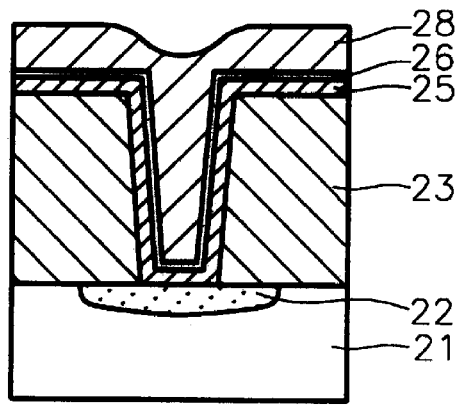
FIGS. 18 to 20 are sectional views for illustrating a second example of a method for forming a wiring layer according to the present invention.
Figure 19:
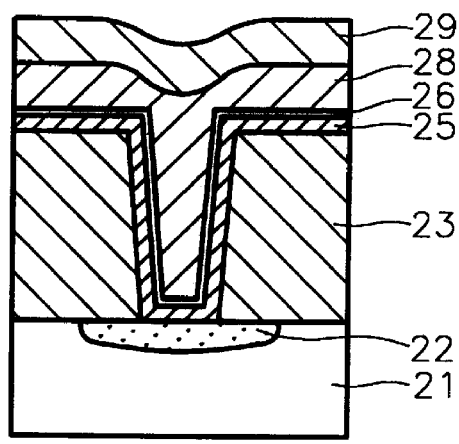
Figure 20:
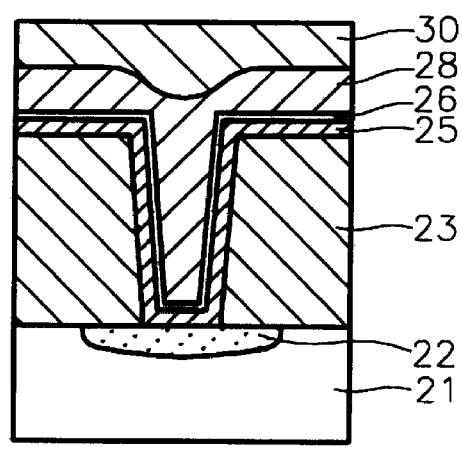

FIGS. 18 to 20 are sectional views for illustrating a second example of a method for forming a wiring layer according to the present invention.

In the present example, the first conductive layer was formed so as to have a thickness of 10 to 80% of a predetermined thickness of the wiring layer, and the first conductive layer was heat-treated according to the above C. S. Park method, to thereby fill the contact hole with the first conductive layer material. Thereafter, a second conductive layer was formed on the heat-treated first conductive layer. In FIGS. 18 to 20, the reference numerals designate the same elements as those in Example 1.

FIG. 18 illustrates a step of filling up contact hole 24 with a material of first conductive layer 27. More particularly, after forming first conductive layer 27 having a thickness of 600 Å to 4,800 Å in FIG. 17 in the same manner as in Example 1, the semiconductor wafer was moved into another sputtering reaction chamber (not shown) without breaking the vacuum, wherein the first conductive layer was heat-treated using an argon conduction method, at a temperature of about 500°–550° C. for about 1–5 minutes, thereby causing the grains of aluminum alloy to migrate into contact hole 24.

Therefore, the complete filling of contact hole 24 with the first conductive layer material, as shown in FIG. 18 was accomplished. Here, some titanium atoms in the hydrogen-treated surface layer 26 reacted with the aluminum, to thereby enhance the filling of first conductive layer 27. After the first conductive layer heat-treating, the filling of the contact hole was observed. As a result, it was found that all the observed contact hole were completely filled with a first conductive layer material. In FIG. 18, reference numeral 28 represents the first conductive layer which completely fills the opening 24.

FIG. 19 illustrates a step of forming a second conductive layer 29 on first conductive layer 28 heat-treated as above. More particularly, second conductive layer 29 was formed by depositing a metal without breaking the vacuum at a temperature below 350° C. using a sputtering method to form a second metal layer, so that the wiring layer has the required total thickness. Second conductive layer 28 was formed by depositing an Al—Cu alloy to a thickness of 5,400 Å to 1,200 Å.

FIG. 20 illustrates a step of a heat-treating the second conductive layer 28, to thereby planarize the surface of the wiring layer. The reference numeral 30 represents the heat-treated second conductive layer. This step was carried out in the same manner as the first conductive layer, without breaking the vacuum.

Performing this step enabled the atoms of the second metal layer to further migrate into contact hole 24, thereby filling it more completely, to result in a wholly planarized wiring layer. Thus, subsequent photolithography steps could be more easily and effectively carried out.

Thereafter, an anti-reflective layer (not shown) was formed by depositing titanium nitride to a thickness of 200–500 Å on the surface of the heat-treated second conductive layer 30, using a sputtering method, in order to improve the subsequent photolithography process. Then, a predetermined resist pattern (not shown) for the wiring layer of a semiconductor device was formed on the anti-reflective layer by a conventional photolithography process, and then using the above resist pattern as an etching mask, anti-reflective layer, the planarized second conductive layer 30, first conductive layer 28 and diffusion barrier layer 25 having hydrogen-treated surface layer 26 formed thereon are subsequently etched to complete the wiring layer according to the present invention.

Comparative Example 2

A metal wiring layer was formed in the same manner as in Example 2, except that the hydrogen-treating step was omitted.

The first conductive layer thus obtained was observed with a microscope and found to have large aluminum grains (about 0.2 $\mu$m) formed thereon, as shown in FIG. 11.

After heat-treating the first conductive layer, the filling of the contact holes was observed. As a result, it was found that only about 50% of the observed contact holes were completely filled with the first conductive layer material.

EXAMPLE 3

Figure 21:
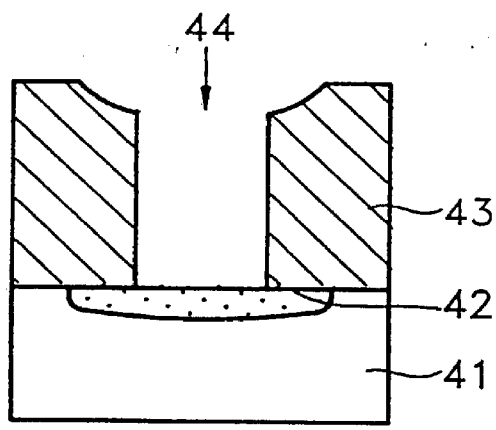
FIGS. 21 to 23 are sectional views for illustrating a third example of a method for forming a wiring layer according to the present invention.
Figure 22:
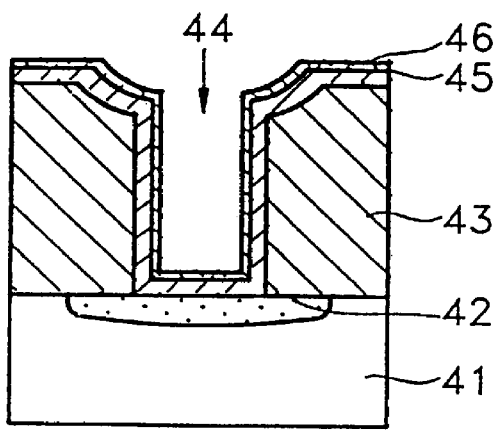
Figure 23:
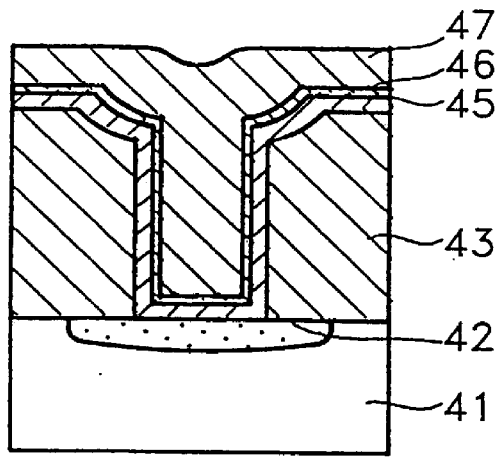

FIGS. 21 to 23 are sectional views for illustrating a third example of a method for forming a wiring layer according to the present invention.

FIG. 21 illustrates a step for forming a contact hole 44 as an opening in an insulating layer 43. More particularly, after forming an insulating layer 43 having a thickness of about 0.8 to 1.5 $\mu$m on a semiconductor substrate 41 by using BPSG, a 0.7 $\mu$m-sized contact hole 44 having a stepped portion formed thereon was formed to thereby expose the surface of impurity-doped region. Then, the semiconductor substrate was cleaned.

FIG. 22 illustrates a step of forming a diffusion barrier layer 45 and a hydrogen-treated surface layer 46 formed thereon. After forming contact hole 44, a diffusion barrier layer 45 comprised of a first diffusion barrier layer comprised of Ti and a second diffusion barrier layer comprised of TiN, was formed and hydrogen-treated, to thereby for hydrogen-treated surface layer 46 in a same manner as in Example 1.

FIG. 23 illustrates a step of forming a first conductive layer 47. More particularly, after the hydrogen-treating step, an Al—Si—Cu alloy (Al-1% Si-0.5% Cu alloy) was deposited without breaking the vacuum to a thickness below approximately 4,800 Å by a sputtering method, while maintaining the temperature of substrate 41 at 0.8 Tm to Tm (where Tm is a melting temperature of the Al—Si—Cu alloy).

Thereafter, in the same manner as in Example 2, a second conductive layer and an anti-reflective layer were formed and then a photolithograpy for forming a wiring layer was subsequentially performed to thereby complete a wiring of a semiconductor device.

When forming first conductive layer 47, since the wettability between the deposited metal layer and diffusion barrier layer 46 was increased, to thereby form a metal layer having large grains (as shown in FIG. 12), atoms of first conductive layer 47 migrated into opening 44.

After observing the void formation with an electron microscope, it was found that a void was not formed in contact hole 44 and contact hole 44 was completely filled with a material constituting first conductive layer 47.

When first conductive layer 47 was formed by firstly depositing a first metal to a thickness of not more than 3,000 Å at a temperature below 150° C. in the same manner as in Example 1 and then secondly depositing a second metal at a high temperature ranging from 0.8 Tm to Tm so that first conductive layer 47 thus obtained has a thickness of 4,800 Å, a void formation was not formed in the contact hole.

EXAMPLE 4

Figure 24:
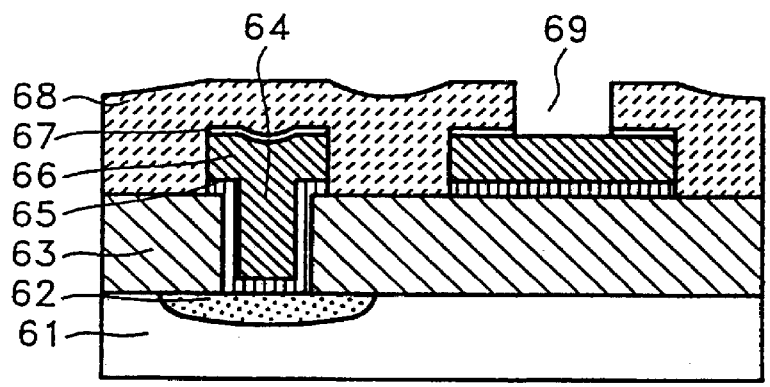
FIGS. 24 and 25 are sectional views for illustrating a fourth example of a method for forming a wiring layer according to the present invention.
Figure 25:
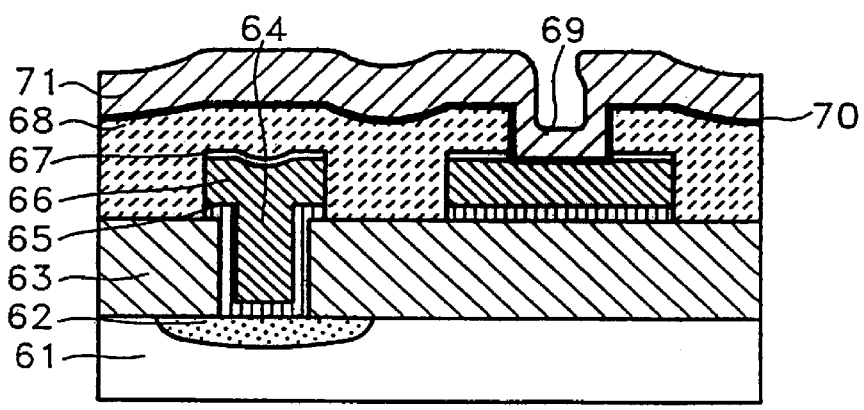

FIGS. 24 and 25 are sectional views for illustrating a fourth example of a method for forming a wiring layer according to the present invention.

FIG. 24 illustrates a step for forming a via hole 69 as an opening in an insulating interlayer 68. More particularly, by using BPSG, a first insulating layer 63 having a thickness of 0.8 to 1.5 $\mu$m was formed on a semiconductor substrate 61 having an impurity-doped region 62 in a surface portion thereof, and then a 0.7 $\mu$m-sized contact hole for electrically connecting a lower wiring layer 64 with impurity-doped region 62 was formed to thereby expose a surface portion of impurity doped region 62. Thereafter, a diffusion barrier layer 65 and lower conductive layer 64 and an antireflective layer 67 were formed and patterned in the same manner as described in Examples 2, to thereby complete lower wiring layer 64. Then, an insulating interlayer 68 comprised of $SiO_2$ was formed on lower wiring layer 67 and first insulating layer 63 for electrically isolating lower wiring layer 66 from other elements of semiconductor device. In insulating interlayer 68, a 1.0 $\mu$m-sized via hole 69 for electrically connecting lower wiring layer 66 with an upper wiring layer was formed to thereby expose lower wiring layer 66.

FIG. 25 illustrates a step of hydrogen-treating insulating interlayer 68 and forming an upper wiring layer. After forming via hole 69, insulating interlayer 68 was hydrogen-treated in the same manner as in Example 1, to thereby form a hydrogen-treated surface layer 70 on the surface portion of insulating interlayer 68 and on the inner surface of via hole 69.

Then, an upper metal layer 71 (for forming an upper wiring layer) was formed by depositing an Al—Cu—Si alloy to a thickness of about 8,000 Å via a sputtering method. The aluminum alloy was deposited at a deposition rate not more than 150 Å/s and at a temperature below 350° C.

Thereafter, in the same manner as in Example 1, after forming an anti-reflective layer, a photolithograpy for forming an upper wiring layer was subsequentially performed to thereby complete an upper wiring layer of a semiconductor device.

When a diffusion barrier layer is not formed prior to forming an upper wiring layer, the under layer of a wiring layer (the surface of insulating inter layer 68) is comprised of $SiO_2$. Thus, when a metal layer is formed by a sputtering method, the wettability between the deposited metal layer and the insulating interlayer, is insufficient. Therefore, the step coverage of the deposited metal layer on the via hole (especially, on the sidewalls of the via hole) becomes poor.

Figure 26:
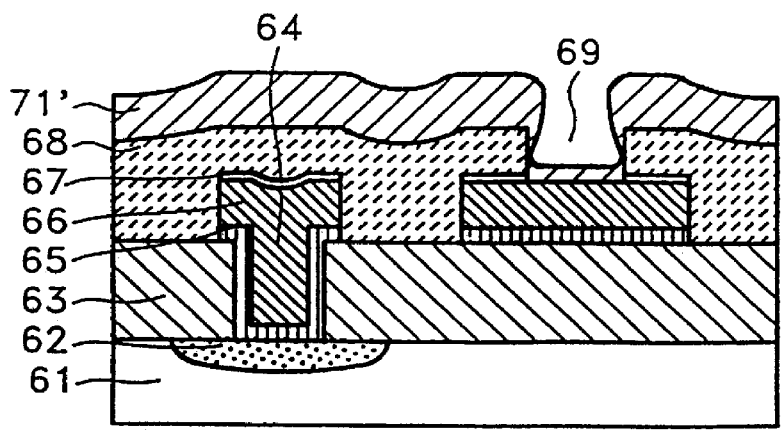
FIG. 26 is a sectional view for illustrating the poor step coverage of a deposited metal layer when deposition was performed on insulating interlayer having a via hole as shown in FIG. 24.

FIG. 26 is a sectional view for illustrating the poor step coverage of a deposited metal layer 71' when a metal is deposited on insulating interlayer 68 having via hole 69 as shown in FIG. 24. In FIG. 26, it can be noted that a discontinuity of deposited metal layer 71' occurs on the sidewalls of via hole 69 due to the poor step coverage of the deposited metal layer 71'.

In the meantime, in Example 4, insulating interlayer 68 having via hole 69 was exposed to the hydrogen plasma or hydrogen radicals so that hydrogen-treated surface layer 70 was formed on the surface of insulating interlayer 68 and on the inner surface of via hole 69. The wettability between the deposited metal layer and the insulating interlayer was improved.

Upper metal layer 71 thus obtained was observed with an electron microscope and found to have large grains of the metal layer (as shown in FIGS. 12 and 14) formed thereon. From this, it can be noted that the step coverage of the metal layer on the via hole was improved. Consequently, the reliability of the upper wiring layer could be enhanced.

Further, during the hydrogen-treating step, the native metal oxides on the exposed surface of the lower wiring layer formed when exposed to the atmosphere by the via hole, were removed. The metal oxides may be removed by a separate argon RF etching or argon ECR etching.

EXAMPLE 5

Figure 27:
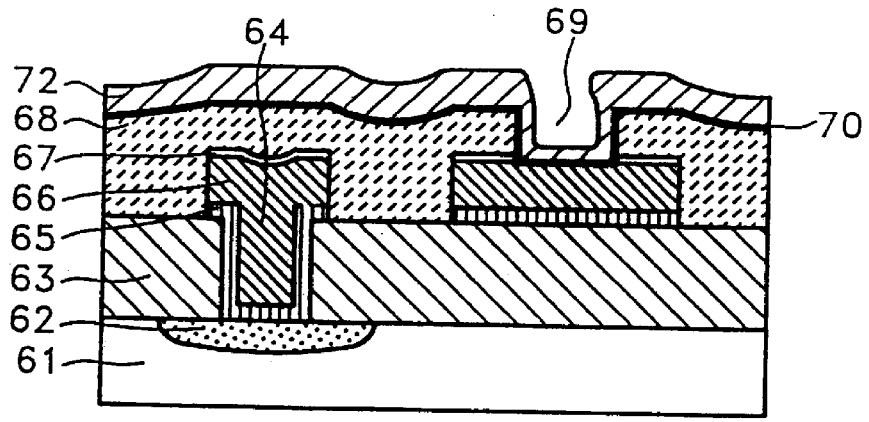
FIGS. 27 to 29 are sectional view for illustrating a fifth example of a method for forming a wiring layer according to the present invention.
Figure 28:
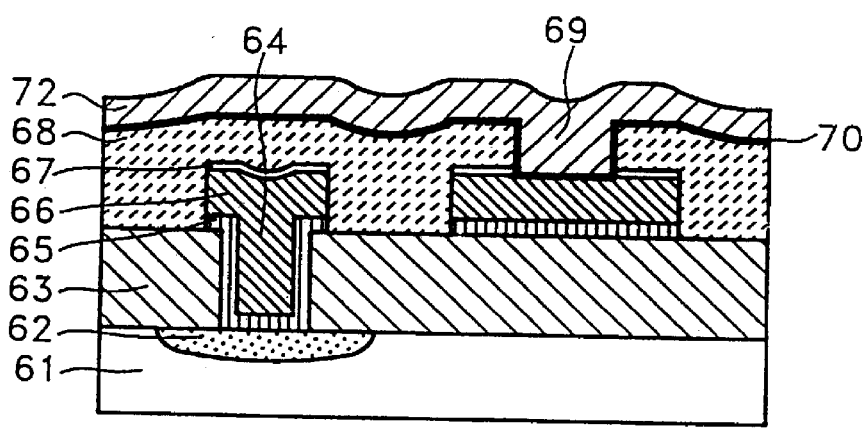
Figure 29:
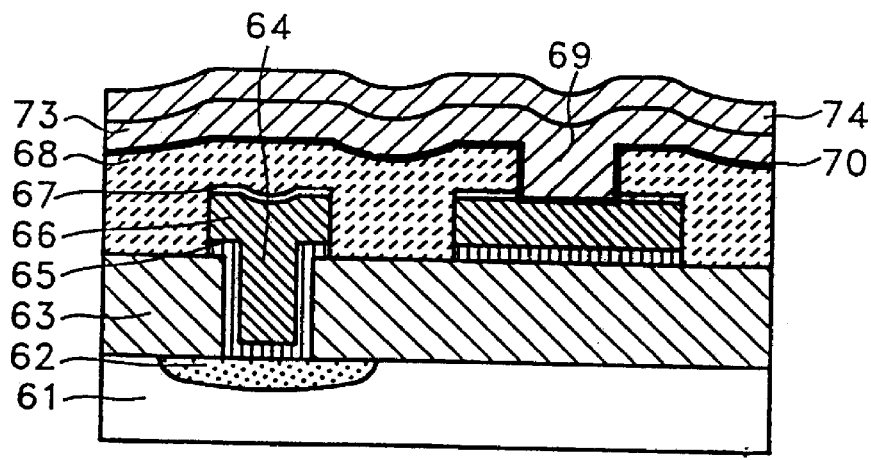

FIGS. 27 to 29 are sectional view for illustrating a fifth example of a method for forming a wiring layer according to the present invention.

FIG. 27 illustrates a step of forming a first conductive layer 72. More particularly, after forming an insulating interlayer 68 having a via hole 69 as shown in FIG. 24 of Example 4, hydrogen-treating step was performed in the same manner as in Example 1. Then, first conductive layer 72 was formed by depositing an aluminum alloy via a sputtering method at a temperature below 150° C. in the same manner as in Example 1. Here, first conductive layer 72 was formed so as to have a thickness of about 10% to 80% (800 Å to 6,400 Å) of a predetermined thickness of the upper wiring layer. A bias voltage of −20 to −200V was applied to semiconductor substrate 61 during the depositing step. Deposition was performed at a deposition rate of 100 Å/s and under an Ar atmosphere of 4 mTorr.

FIG. 28 illustrate a step of filling up via hole 69 with the material of first conductive layer 72 by heat-treating.

The heat-treating step was carried out in the same manner as in Example 2. Here, reference numeral 73 represents the first conductive layer after the heat-treatment step which completely fills via hole 69.

FIG. 29 illustrate a step of forming a second conductive layer 74. After, the step of FIG. 28, second conductive layer 74 was formed by depositing an aluminum alloy at a temperature below 350° C. and at a deposition rate of about 150 Å/s in the same manner as in Example 2.

Thereafter, in the same manner as in Example 1 , after forming an anti-reflective layer, a photolithograpy for forming an upper wiring layer was subsequentially performed to thereby complete an upper wiring layer of a semiconductor device.

After heat-treating first conductive layer 72, the void formation was observed with an electron microscope, and it was found that a void formation was not formed in via hole 69 and all the observed via holes 69 were completely filled with a material of first conductive layer 72.

When a diffusion barrier layer was formed prior to the hydrogen-treating step in FIG. 27, the same results were obtained.

According to the present invention, hydrogen-treating the underlayer improves the wettability between the deposited metal layer and the underlayer. Since a pure aluminum or an aluminum alloy is deposited on the hydrogen-treated surface layer of the underlayer having the improved wettability, a deposited metal layer having larger grains than the conventional method, can be formed as shown in FIGS. 12 and 14. Thus, the step coverage of the metal layer is remarkably enhanced to thereby improve the reliability of the wiring layer of the semiconductor. In the meantime, the barrier effect of the diffusion barrier layer is maintained equal to that of the conventional method. Further, when heat-treating the metal layer (which has been deposited at a low temperature) at a high temperature (somewhat below the melting point of the metal) or when depositing a metal a high temperature via a sputtering method, the migration of the grains of the metal layer is increased. Therefore, filling an opening such as a contact hole or a via hole with a deposited metal can be more easily performed than a conventional method and C. S. Park method.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A method for forming a wiring layer of a semiconductor device, comprising the steps of:
   forming an insulating layer on a substrate;
   forming a contact hole in said insulating layer, to thereby expose a portion of said substrate;
   forming a diffusion barrier layer on said insulating layer and said exposed portion of said substrate;
   annealing said diffusion barrier layer under a nitrogen atmosphere, while introducing oxygen into said nitrogen atmosphere, to thereby form an oxide layer on said diffusion barrier layer;
   hydrogen-treating the resultant structure produced by the preceding steps in a hydrogen plasma, to thereby form a hydrogen-treated surface layer on said oxide layer; and
   forming a conductive layer on said hydrogen-treated surface layer,
   wherein the atoms in said hydrogen treated surface layer react with said conductive layer, to thereby enhance the filling of said contact hole and the adhesion property of said hydrogen-treated surface layer to said conductive layer.

2. The method as set forth in claim 1, wherein said annealing step is carried out at a temperature in a range of 450° C.–500° C., and for a time period of 30–60 minutes.

3. The method as set forth in claim 1, wherein said hydrogen-treating step is carried out in a vacuum, and the step of forming said conductive layer is carried out without breaking said vacuum.

4. The method as set forth in claim 1, wherein said hydrogen-treating step is carried out in a vacuum, and the step of forming said conductive layer is carried out without breaking said vacuum.

5. The method as set forth in claim 1, wherein said diffusion barrier layer is formed of a material selected from the group consisting of transition metals, transistion metal alloys, and transistion metal compounds.

6. The method as set forth in claim 1, wherein the step of forming a diffusion barrier layer includes the steps of:
   forming a first diffusion barrier sub-layer on said insulating layer and said exposed surface of said substrate;
   forming a second diffusion sub-layer on said first diffusion barrier sub-layer, wherein said first and second diffusion barrier sub-layers together comprise said diffusion barrier layer.

7. The method as set forth in claim 6, wherein said first diffusion barrier sub-layer is comprised of a transition metal, and said second diffusion barrier sub-layer is comprised of a material selected from the group consisting of transition metal compounds and transition metal alloys.

8. The method as set forth in claim 1, wherein the step of forming a conductive layer includes the steps of:

forming a first conductive sub-layer on said hydrogen-treated surface layer to partially fill said contact hole; and, forming a second conductive sub-layer on said first conductive sub-layer to completely fill said contact hole.

9. The method as set forth in claim 8, wherein the step of forming a first conductive sub-layer is peformed in a vacuum at a first temperature of less than 150° C.

10. The method as set forth in claim 9, wherein the step of forming a second conductive sub-layer is performed at a second temperature higher than said first temperature.

11. The method as set forth in claim 1, wherein the step of forming a conductive layer includes the steps of:

forming a first conductive sub-layer on said hydrogen-treated surface layer to partially fill said contact hole;

heat-treating said first conductive sub-layer; and, forming a second conductive sub-layer on said first conductive sub-layer to completely fill said contact hole.

12. The method as set forth in claim 11, wherein the steps of forming a first conductive sub-layer and heat-treating said first conductive sub-layer are performed in a vacuum, without breaking said vacuum.

13. The method as set forth in claim 12, wherein the step of heat-treating said first conductive sub-layer is carried out at a temperature in the range of 0.8 Tm—Tm, where Tm is the melting temperature of said first conductive sub-layer.

14. The method as set forth in claim 13, wherein the step of forming a first conductive sub-layer is carried out at a temperature below 150° C.

15. The method as set forth in claim 14, further comprising the step of heat-treating said second conductive sub-layer at a temperature in the range of 0.8 Tm1—Tm1, wherein Tm1 is the melting temperature of said second conductive sub-layer, to thereby planarize said second conductive sub-layer.

16. The method as set forth in claim 15, wherein the step of forming said second conductive sub-layer is carried out at a temperature in the range of 150° C.–350° C.

17. The method as set forth in claim 8, wherein said first conductive sub-layer is comprised of a first metal having a Si component, and said second conductive sub-layer is comprised of a second metal having no Si component.

18. The method as set forth in claim 11, wherein the steps of forming a first conductive sub-layer, heat-treating said first conductive sub-layer, and forming said second conductive sub-layer are performed in a vacuum, without breaking said vacuum.

19. The method as set forth in claim 1, wherein said substrate comprises a lower conductive layer of the semiconductor device.

20. The method as set forth in claim 1, wherein said substrate comprises a semiconductor substrate.

\* \* \* \* \*